United States Patent
Hopkins et al.

(10) Patent No.: US 12,281,593 B1
(45) Date of Patent: Apr. 22, 2025

(54) FLUID FLOW DISTRIBUTOR FOR VAPOR PHASE COATING OF TURBINE COMPONENTS

(71) Applicant: Chromalloy Gas Turbine LLC, Palm Beach Gardens, FL (US)

(72) Inventors: Zachary Charles Hopkins, San Diego, CA (US); Michael Gore, San Diego, CA (US)

(73) Assignee: Chromalloy Gas Turbine LLC, Palm Beach Gardens, FL (US)

( * ) Notice: Subject to any disclaimer, the term of this patent is extended or adjusted under 35 U.S.C. 154(b) by 0 days.

(21) Appl. No.: 18/619,014

(22) Filed: Mar. 27, 2024

(51) Int. Cl.
 *F01D 5/18* (2006.01)
(52) U.S. Cl.
 CPC ............ *F01D 5/18* (2013.01); *F05D 2230/20* (2013.01); *F05D 2230/31* (2013.01); *F05D 2230/90* (2013.01)
(58) Field of Classification Search
 CPC ....... C23C 16/045; C23C 10/06; C23C 10/10; C23C 16/4409; C23C 16/4488; C23C 10/48; C23C 16/12; C23C 16/20; C23C 16/45563; C23C 16/56; F01D 25/285; F01D 5/288; F01D 5/18; F01D 5/187; F01D 5/323; F05D 2230/90; F05D 2230/20; F05D 2230/31; F05D 2260/30; F05D 2230/68; Y10S 118/10
 See application file for complete search history.

(56) References Cited

U.S. PATENT DOCUMENTS

| | | | |
|---|---|---|---|
| 5,928,725 A * | 7/1999 | Howard | C23C 16/045 427/237 |
| 9,476,119 B2 * | 10/2016 | Atwal | C23C 16/4409 |
| 11,629,424 B2 | 4/2023 | Whitton et al. | |
| 2007/0274831 A1 * | 11/2007 | Beck | F01D 5/187 416/97 R |

* cited by examiner

Primary Examiner — Eric J Zamora Alvarez
(74) Attorney, Agent, or Firm — Nixon & Vanderhye P.C.

(57) ABSTRACT

A fluid flow distributor includes a manifold body having a first chamber configured to receive the supply of coating gas. A pair of inlet nozzles protrude from an upper surface of the manifold body for insertion into a turbine blade for delivering the coating gas to the internal cavities of the turbine blade. The inlet nozzles may be tapered to facilitate insertion of the inlet nozzles into a root portion of the turbine blade. The fluid flow distributor may have a geometry that promotes laminar flow of the coating gas.

20 Claims, 16 Drawing Sheets

FLUID FLOW DISTRIBUTOR FOR VAPOR PHASE COATING OF TURBINE COMPONENTS

TECHNICAL FIELD

The present technology relates generally to devices for distributing a vapor phase coating to turbine engine components, and more particularly to manifolds for managing inlet and outlet flows of a vapor phase coating into and out of the internal cavities of turbine components such as turbine blades.

BACKGROUND

A gas turbine engine typically comprises a multi-stage compressor coupled to a multi-stage turbine via an axial shaft. Air enters the gas turbine engine through the compressor where its temperature and pressure increase as it passes through subsequent stages of the compressor. The compressed air is then directed to one or more combustors where it mixes with a fuel source to create a combustible mixture. This mixture is ignited in the one or more combustors to create a flow of hot combustion gases. These gases are directed into the turbine causing the turbine to rotate, thereby driving the compressor. The output of the gas turbine engine can be mechanical thrust via exhaust from the turbine or shaft power from the rotation of an axial shaft, where the axial shaft can drive a generator to produce electricity.

The turbine section of the gas turbine engine typically comprises a plurality of alternating stages of rotating and stationary airfoils. Due to the operating temperatures and mechanical load experienced in the turbine section, these rotating and stationary airfoils, also commonly referred to as blades and vanes, respectively, are cast from high strength, high temperature alloys, such as nickel and cobalt. Depending on the specific temperature at each stage of the turbine, many of these blades are hollow and air-cooled. In order to maximize and extend service life, many blades include the application of one or more coatings to various internal and external surfaces of the blade.

One such coating process applied to internal and external surfaces of turbine components is a vapor phase coating process, such as vapor phase aluminizing (VPA) or vapor phase chromizing (VPC).

A fluid flow distributor may be used to distribute the coating gas to the internal cavities of the turbine components. However, conventional fluid flow distributors do not promote desirable fluid flow characteristics and often result in coatings that are uneven or have poor coverage.

SUMMARY

One aspect of the disclosed technology relates to a fluid flow distributor for insertion into a root portion of a turbine component for conveying a coating gas to internal flow channels of the turbine component, the fluid flow distributor comprising: a manifold body having a first inlet port configured to receive a supply of coating gas, the manifold body having an upper surface; a first chamber formed in an interior space of the manifold body and configured to receive the supply of coating gas via the first inlet port; a first inlet nozzle protruding from the upper surface and including a first inlet nozzle channel in fluid communication with the first chamber, the first inlet nozzle having a first inlet nozzle tip and a first intermediate portion disposed between the first inlet nozzle tip and the upper surface of the manifold body; and a second inlet nozzle protruding from the upper surface, the second inlet nozzle having a second inlet nozzle tip and a second intermediate portion disposed between the second inlet nozzle tip and the upper surface of the manifold body, wherein the first intermediate portion and the second intermediate portion are tapered, respectively, towards the first inlet nozzle tip and the second inlet nozzle tip to facilitate insertion of the first inlet nozzle and the second inlet nozzle into a root portion of a turbine component.

A further aspect of the disclosed technology includes the preceding aspect and wherein the second inlet nozzle includes a second inlet nozzle channel in fluid communication with the first chamber.

A further aspect of the disclosed technology includes any of the preceding aspects and wherein the manifold body has a second inlet port configured to receive the supply of coating gas, a second chamber being formed in the interior space of the manifold body and configured to receive the supply of coating gas via the second inlet port, the second inlet nozzle including a second inlet nozzle channel in fluid communication with the second chamber, and wherein the first chamber and the second chamber are not fluidly connected in the manifold body.

A further aspect of the disclosed technology includes any of the preceding aspects and wherein the first inlet nozzle includes a first base portion disposed between the first intermediate portion and the upper surface of the manifold body.

A further aspect of the disclosed technology includes any of the preceding aspects and wherein the first base portion comprises a first fillet having a curved surface that provides a smooth transition between the first intermediate portion and the upper surface of the manifold body.

A further aspect of the disclosed technology includes any of the preceding aspects and wherein the taper of the first intermediate portion and the fillet of the first base portion are configured to guide insertion of the first inlet nozzle into the root portion of the turbine component such that the fluid flow distributor self-locates relative to the turbine component.

A further aspect of the disclosed technology includes any of the preceding aspects and further comprising a third inlet nozzle protruding from the upper surface and including a third inlet nozzle channel in fluid communication with the first chamber.

A further aspect of the disclosed technology includes any of the preceding aspects and wherein the first inlet nozzle, the second inlet nozzle and the third inlet nozzle are linearly aligned along the upper surface of the manifold body.

A further aspect of the disclosed technology includes any of the preceding aspects and further comprising an exhaust nozzle protruding from the upper surface and including an exhaust nozzle channel, the exhaust nozzle having an exhaust nozzle tip and an exhaust nozzle intermediate portion disposed between the exhaust nozzle tip and the upper surface of the manifold body, wherein the exhaust nozzle intermediate portion is tapered towards the exhaust inlet nozzle tip to facilitate insertion of the exhaust nozzle into the root portion of the turbine component.

A further aspect of the disclosed technology includes any of the preceding aspects and wherein the exhaust nozzle channel is connected to an exhaust passageway that is not in fluid communication with the first chamber, the exhaust passageway being fluidly connected to an exhaust port of the manifold body.

A further aspect of the disclosed technology includes any of the preceding aspects and wherein the exhaust nozzle channel is in fluid communication with an exhaust chamber formed in the manifold body, the exhaust chamber being fluidly connected to an exhaust port of the manifold body, wherein the manifold body has a second inlet port in fluid communication with a second chamber formed in the manifold body, the second inlet nozzle including a second inlet nozzle channel in fluid communication with the second chamber, and wherein none of the first chamber, the second chamber and the exhaust chamber are fluidly connected in the manifold body.

Another aspect of the disclosed technology relates to a fluid flow distributor for insertion into a root portion of a turbine component for conveying a coating gas to internal flow channels of the turbine component, the fluid flow distributor comprising: a manifold body having a first inlet port configured to receive a supply of coating gas, the manifold body having an upper surface; a first chamber formed in an interior space of the manifold body and configured to receive the supply of coating gas via the first inlet port; a first inlet nozzle protruding from the upper surface and including a first inlet nozzle channel in fluid communication with the first chamber, the first inlet nozzle being configured to be inserted into the root portion of a turbine component for conveying a coating gas from the first inlet nozzle channel into an internal cavity of the turbine component; and a first locating member protruding from the upper surface of the manifold body and configured for mating with a first recess formed in the root portion of the turbine component for locating and securing the fluid flow distributor relative the turbine component when the first inlet nozzle is inserted into the root portion of the turbine component.

A further aspect of the disclosed technology includes any of the preceding aspects and wherein the first locating member is positioned along a first lateral edge portion of the upper surface of the manifold body.

A further aspect of the disclosed technology includes any of the preceding aspects and further comprising a second locating member protruding from the upper surface of the manifold body and configured for mating with a second recess formed in the root portion of the turbine component for locating and securing the fluid flow distributor relative the turbine component when the first inlet nozzle is inserted into the root portion of the turbine component.

A further aspect of the disclosed technology includes any of the preceding aspects and wherein the second locating member is positioned along a second lateral edge portion of the upper surface of the manifold body, the second lateral edge portion being opposite the first lateral edge portion.

A further aspect of the disclosed technology includes any of the preceding aspects and wherein the first inlet nozzle is disposed along the upper surface of the manifold body at a position between the first locating member and the second locating member.

A further aspect of the disclosed technology includes any of the preceding aspects and wherein further comprising a second inlet nozzle protruding from the upper surface and including a second inlet nozzle channel in fluid communication with the first chamber, the second inlet nozzle being configured to be inserted into the root portion of the turbine component for conveying the coating gas from the second inlet nozzle channel into the internal cavity of the turbine component.

Another aspect of the disclosed technology relates to a method of making a fluid flow distributor, the fluid flow distributor being configured for insertion into a root portion of a turbine component for conveying a coating gas to internal flow channels of the turbine component, the method comprising: 1) storing data to non-transitory storage, said data including parameters associated with fluid dynamics of a fluid flow through internal cavities of a turbine component, said parameters including information defining a geometry of the internal cavities; said data including information defining a geometry of a fluid flow distributor; 2) using a computing device with at least one hardware processor to predict characteristics of the fluid flow through the internal cavities of the turbine component when the fluid flow passes through the fluid flow distributor before entering the internal cavities of the turbine component; 3) using the computing device to optimize the characteristics of the fluid flow according to desired characteristics by modifying the information defining the geometry of the fluid flow distributor; and 4) 3D printing the fluid flow distributor such that a geometry of the 3D-printed fluid flow distributor corresponds to the modified information defining the geometry of the fluid flow distributor.

A further aspect of the disclosed technology includes any of the preceding aspects and wherein the information defining the geometry of the fluid flow distributor includes a volume of a chamber in an interior space of the fluid flow distributor.

A further aspect of the disclosed technology includes any of the preceding aspects and wherein the information defining the geometry of the fluid flow distributor includes a size of a nozzle opening of a first nozzle of the fluid flow distributor.

BRIEF DESCRIPTION OF THE DRAWINGS

The accompanying drawings facilitate an understanding of the various examples of this technology. In such drawings:

FIG. 2-1 is a perspective view of a flow distributor according to an example of the disclosed technology;

FIG. 2-2 is a top view of the flow distributor of FIG. 2-1;

FIG. 2-3 is a cross-sectional view of the flow distributor of FIG. 2-2 along the line 2-3-2-3;

FIG. 2-4 is a cross-sectional view of the flow distributor of FIG. 2-2 along the line 2-4-2-4;

FIG. 3-1 is a side perspective view of a turbine blade according to an example of the disclosed technology;

FIG. 3-2 is a bottom perspective view of the turbine blade of FIG. 3-1;

FIG. 4 is a perspective view of the turbine blade of FIG. 3-1 with the external walls removed to reveal the internal cavities of the turbine blade;

FIG. 9-1 is an enlarged detail of the root portion of the turbine blade in FIG. 9;

FIG. 9-2 is a cross-sectional view showing the flow distributor of FIG. 2-1 inserted into the turbine blade of FIG. 3-1;

FIG. 10-1 is a perspective view of a flow distributor according to an example of the disclosed technology;

FIG. 10-2 is a bottom perspective view of the flow distributor of FIG. 10-1;

FIG. 10-3 is a cross-sectional view along the line 10-3-10-3 in FIG. 10-1;

FIG. 11-1 is a perspective view of a flow distributor according to an example of the disclosed technology;

FIG. 11-2 is a bottom perspective view of the flow distributor of FIG. 11-1;

FIG. 11-3 is a cross-sectional view along the line 11-3-11-3 in FIG. 11-1;

FIG. 12-1 a perspective view of a flow distributor according to an example of the disclosed technology;

FIG. 12-2 is a bottom perspective view of the flow distributor of FIG. 12-1;

FIG. 12-3 is a cross-sectional view along the line 12-3-12-3 in FIG. 12-1; and

DETAILED DESCRIPTION OF EXAMPLE NON-LIMITING EMBODIMENTS

Figure 1:
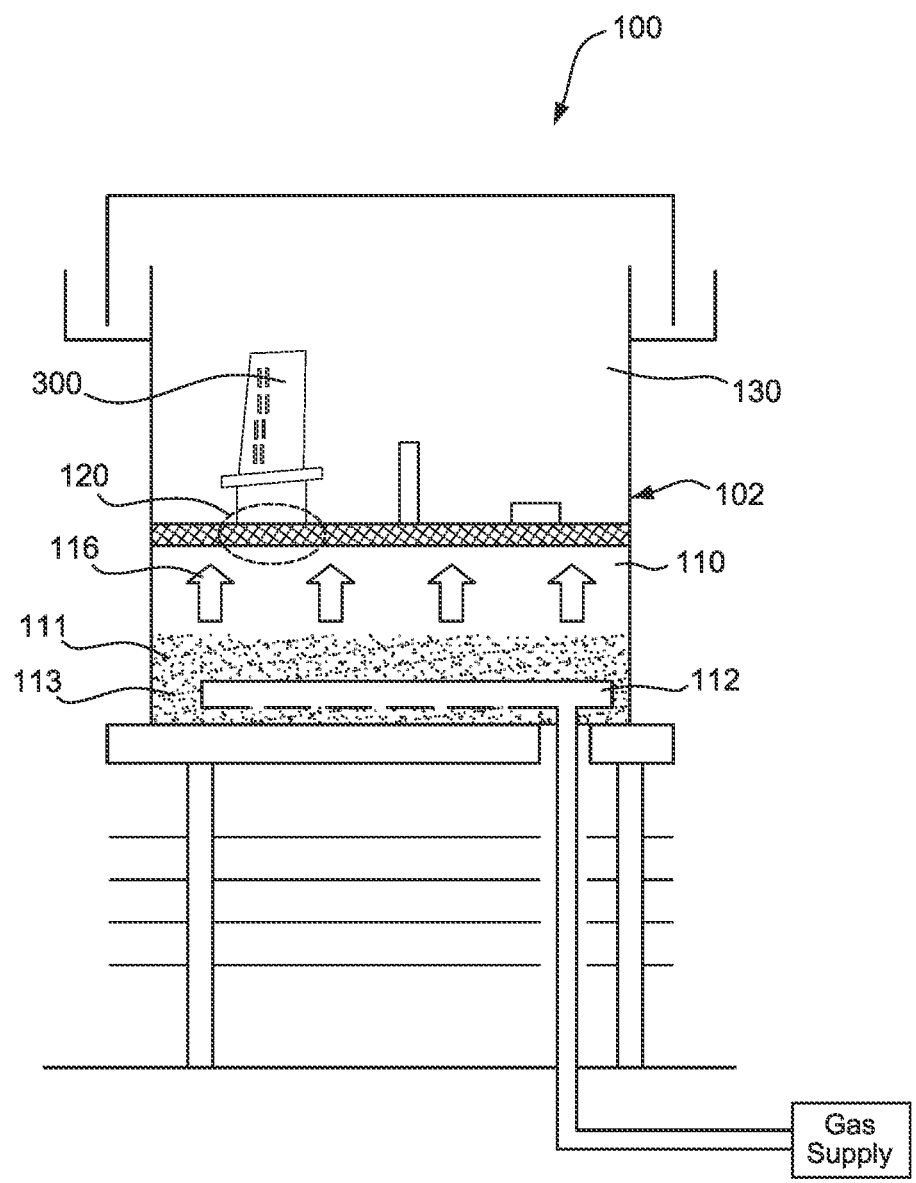
FIG. 1 is a schematic representation of a vapor phase aluminizing device according to an example of the disclosed technology.

Referring to FIG. 1, a vapor phase coating device 100 for performing a vapor phase coating process on a plurality of turbine blades 300 is shown. In the illustrated example, the vapor phase coating device 100 is configured to perform a vapor phase aluminizing process (VPA), however other vapor phase coating processes are applicable, such as vapor phase chromizing (VPC).

The vapor phase coating device 100 comprises a furnace with a container 102. The coating process is typically performed at temperatures between about 982° C. and about 1177° C. The container 102 includes an activation chamber 110 and a coating chamber 130. In the activation chamber, an activator 113 is mixed with donor material 111 (e.g., aluminum granules) and an inert gas supply 112 to produce a coating gas 116 (e.g., an aluminum rich vapor). The coating gas 116 is flowed through the turbine internal cavity to provide a diffused coating (e.g., aluminide coating) on the internal surfaces of the turbine blade 300. The coating gas 116 may also be allowed to fill the coating chamber 130 to enable deposition onto the external surfaces of the turbine blades. Coating runs are typically between 6 and 10 hours in duration and may provide a coating thickness in the range of about 0.0254 mm to about 0.1016 mm. The flow rate of the coating gas into the coating chamber 130 may be in the range of about 0.2832 cubic meters per hour (CMH) to about 5.6633 CMH. The flow rate to each turbine blade may be in the range of about 0.0057 CMH to about 0.1982 CMH.

As can be seen in FIG. 1, a transition area 120 exists between the activation chamber 110 and the coating chamber 130. In the transition area 120, the coating gas 116 is directed into the internal cavities of the turbine blade 300. To facilitate this effort, a flow distributor 200 (e.g., a manifold), as shown in FIG. 2-1, is used to direct the coating gas 116 from the activation chamber 110 into the internal cavities of the turbine blade.

Figures 1, 2:
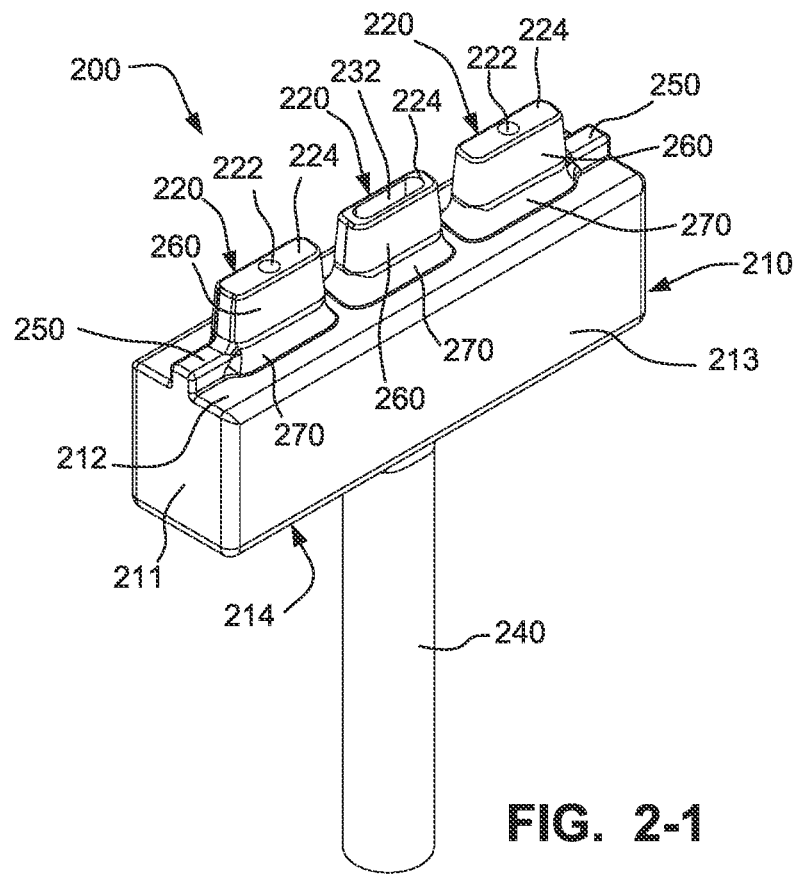
Figure 2:
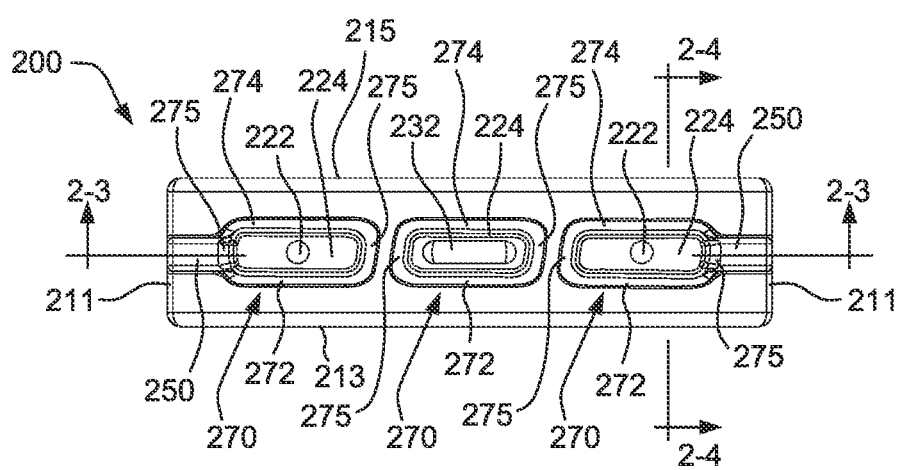

Referring to FIG. 2-1, the flow distributor 200 is configured to receive the coating gas 116 via a conduit 240 and to discharge the coating gas into the internal cavities of the turbine blade via a plurality of inlet nozzles 220 (e.g., two outer inlet nozzles and a central inlet nozzle) (although more or fewer (e.g., 1, 3 or 4) inlet nozzles may be used depending on the configuration of the blade internal cavities). As will be described later, in other examples one or more of the inlet nozzles may instead be exhaust nozzles. The flow distributor 200 includes a manifold body 210 having an upper surface 212 and an underside surface 214. The manifold body 210 may have a rectangular box shape including a front surface 213 and a rear surface 215 (e.g., long sides) and side surfaces 211 (e.g., short sides). However, the manifold body 210 could have other shapes, e.g., a cylindrical shape.

Figures 2, 3:
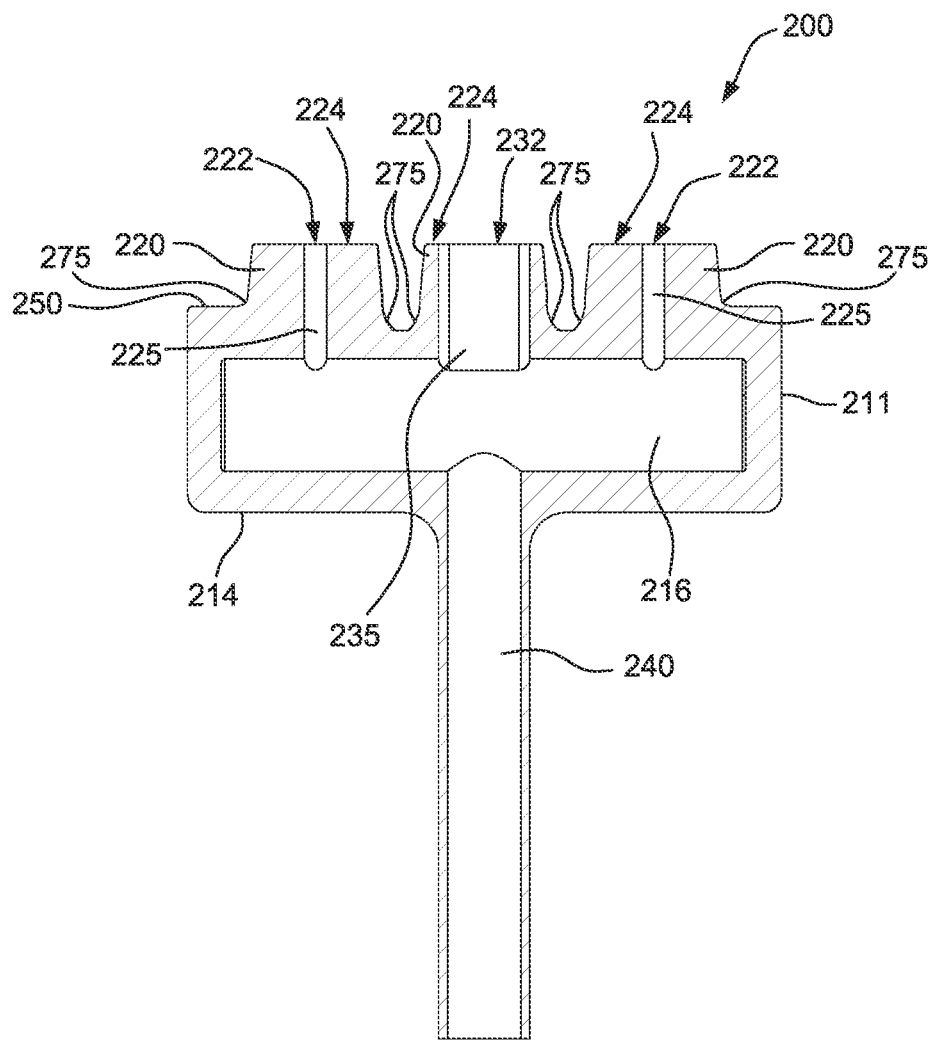

Referring to FIGS. 2-1 and 2-3, the conduit 240 connects to an inlet port in the underside surface 214 so as to fluidly connect with a manifold chamber 216 formed in the manifold body 210. Each inlet nozzle 220 includes an inlet nozzle channel, a nozzle tip and an inlet nozzle opening formed in the nozzle tip. The inlet nozzle channel connects to the manifold chamber and the inlet nozzle opening is used to discharge the coating gas 116 into the turbine blade 300. The two inlet nozzles 220 disposed on the outer sides of the manifold body 210 include an inlet nozzle channel 225, a nozzle tip 224 and an inlet nozzle opening 222 formed in the nozzle tip. The inlet nozzle 220 disposed towards a central portion of the manifold body may have a nozzle channel, nozzle tip and nozzle opening that are the same as in the other two nozzles. However, in other examples, the inlet nozzle 220 disposed towards the central portion of the manifold body may have a different structural arrangement as compared to the other inlet nozzles. For example, in the illustrated example, the internal cavities of the turbine blade that are fed by each of the inlet nozzles may have different sizes and thus require different flow volumes in order to adequately coat the internal surfaces of the turbine blade. As such, the inlet nozzle 220 disposed towards the central portion of the manifold body may include an inlet nozzle channel 235 and an inlet nozzle opening 232 that are larger than the inlet nozzle channel 225 and the inlet nozzle opening 222 in the inlet nozzles disposed at the outer sides of the manifold body, in order to supply a larger flow volume to the centrally disposed inlet nozzle (and thus the corresponding internal cavity of the turbine blade). It should be noted that any of the inlet nozzles could have a relatively smaller or relatively larger nozzle channel and/or nozzle opening (to appropriately adjust the volume flow rate) depending on the internal cavity arrangement of the turbine blade. For example, the inlet nozzle having the larger nozzle channel and larger nozzle opening may be located at the outer sides of the manifold body 210 rather than at the central portion.

The flow distributor 200 may be configured so that once the coating gas 116 flows through the internal cavity of the turbine blade, the coating gas will exit the blade either through exit holes formed in external surfaces of the blade airfoil or through a specified flow channel at the base of the blade root and back into the flow distributor. The flow distributor 200 is configured to function with a turbine blade (e.g., turbine blade 300) having exit holes 312 through which the coating gas 116 may exit.

The geometry of the flow distributor 200 may be configured to facilitate a desired flow through the internal cavity of the turbine blade 300. For example, it is desirable to provide a laminar flow of the coating gas 116 through the internal cavity of the turbine blade in order to achieve optimum coating results (e.g., even deposition, actual coverage of intended surfaces, and desired coating thickness). Features of the flow distributor 200, such as size (e.g., volume) and shape of the manifold chamber 216, size of the inlet nozzle channels 225, 235, and size of the inlet nozzle openings 222, 232 may be adjusted to modify fluid flow characteristics of the coating gas 116 in order to achieve optimum fluid flow characteristics.

Turning back to FIGS. 2-1 and 2-4, the inlet nozzles 220 protrude from the upper surface 212 of the manifold body 210. The height (H) of the inlet nozzles corresponds to a distance that the nozzles will be inserted into the internal cavities of the turbine blade. Portions of the blade internal wall surfaces near entrances to the turbine internal cavities will be covered by the nozzles when inserted into the turbine blade. These portions of the internal wall surfaces will typically not be coated during the coating process since the inserted nozzles block the coating gas from reaching those surfaces. Thus, as will be described later, the height (H) of the inlet nozzles determines how close to the entrance of the internal cavities the coating will be deposited.

Each inlet nozzle 220 includes a base portion 270 and an intermediate portion 260, as shown in FIG. 2-1. The base portion 270 is connected to the upper surface of the manifold body 210 and may be configured to provide a smooth transition between the upper surface 212 and the intermediate portion 260. For example, the base portion 270 may comprise a fillet. Turning to FIG. 2-2, each base portion 270 may comprise a front section 272, a rear section 274 that is opposite the front section, and two side sections 275 that extend between and connect the front section 272 and the rear section 274 at opposite sides of the nozzle.

Referring to FIG. 2-1, the intermediate portion 260 of each inlet nozzle is disposed between the base portion 270 and the nozzle tip 224, 234 of the nozzle. The intermediate portion 260 may comprise an external surface of the nozzle that tapers towards the nozzle tip (e.g., from the base portion 270 to the nozzle tip, or at least along a portion of the intermediate portion). In this way, the base portion may form part of a gradual taper towards the nozzle tip, or alternatively, the base portion may taper at a rate that is different from the taper along the intermediate portion (e.g., steeper or less steep/more gradual). In the illustrated example, the taper along the base portion 270 is steeper than the taper long the intermediate portion 260, as can be seen in FIG. 2-1. The tapering configuration of the inlet nozzles 220 facilitates easy insertion of the nozzles into the turbine blade while maintaining clearance with the inner walls of the blade internal flow channels to prevent damage to the inner walls of the blade.

Figures 2, 3, 4:
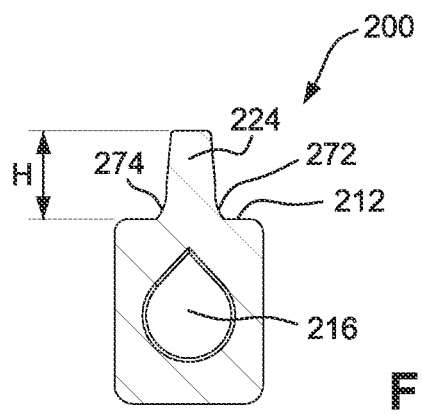
Figures 1, 3:
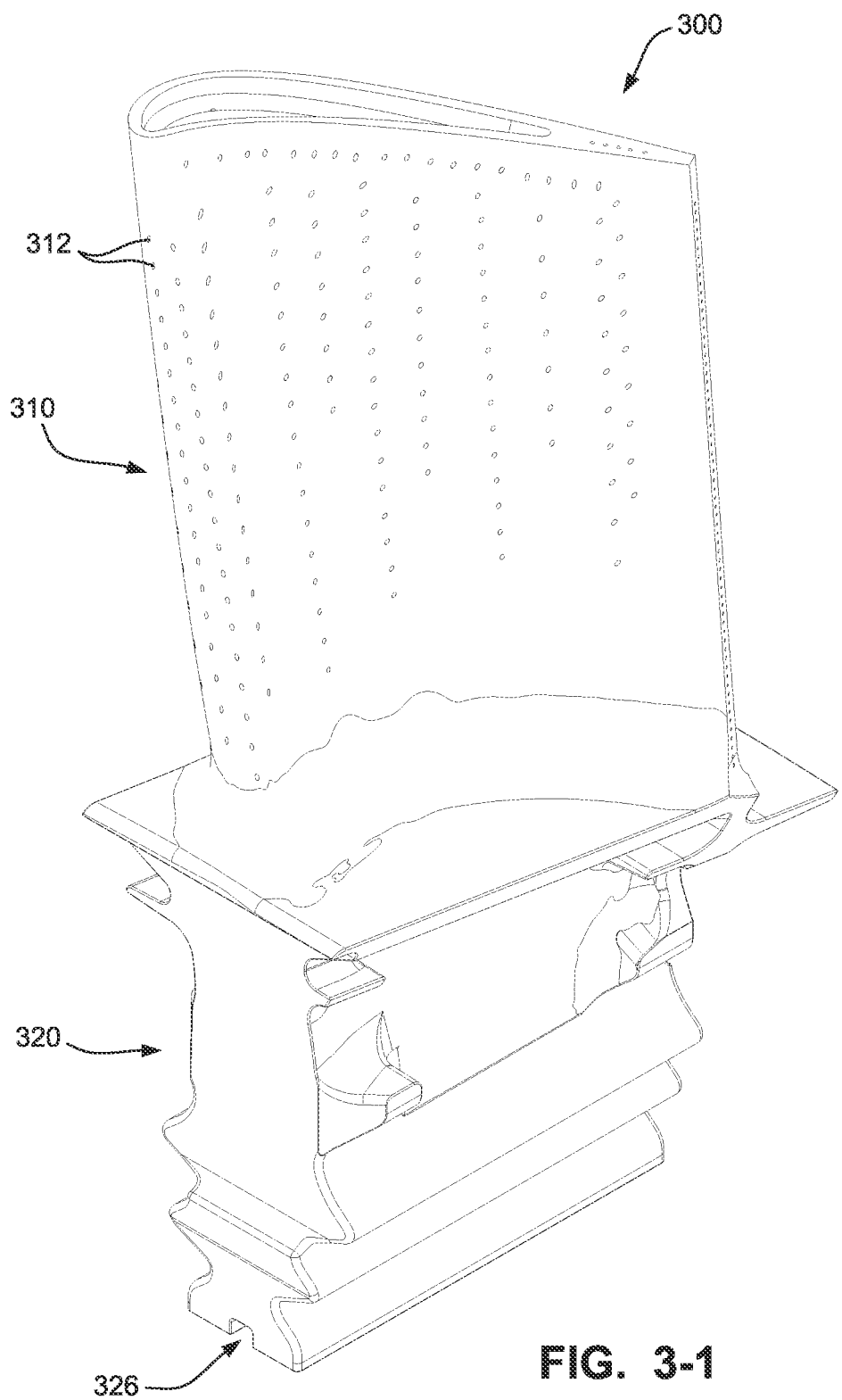
Figures 2, 3:
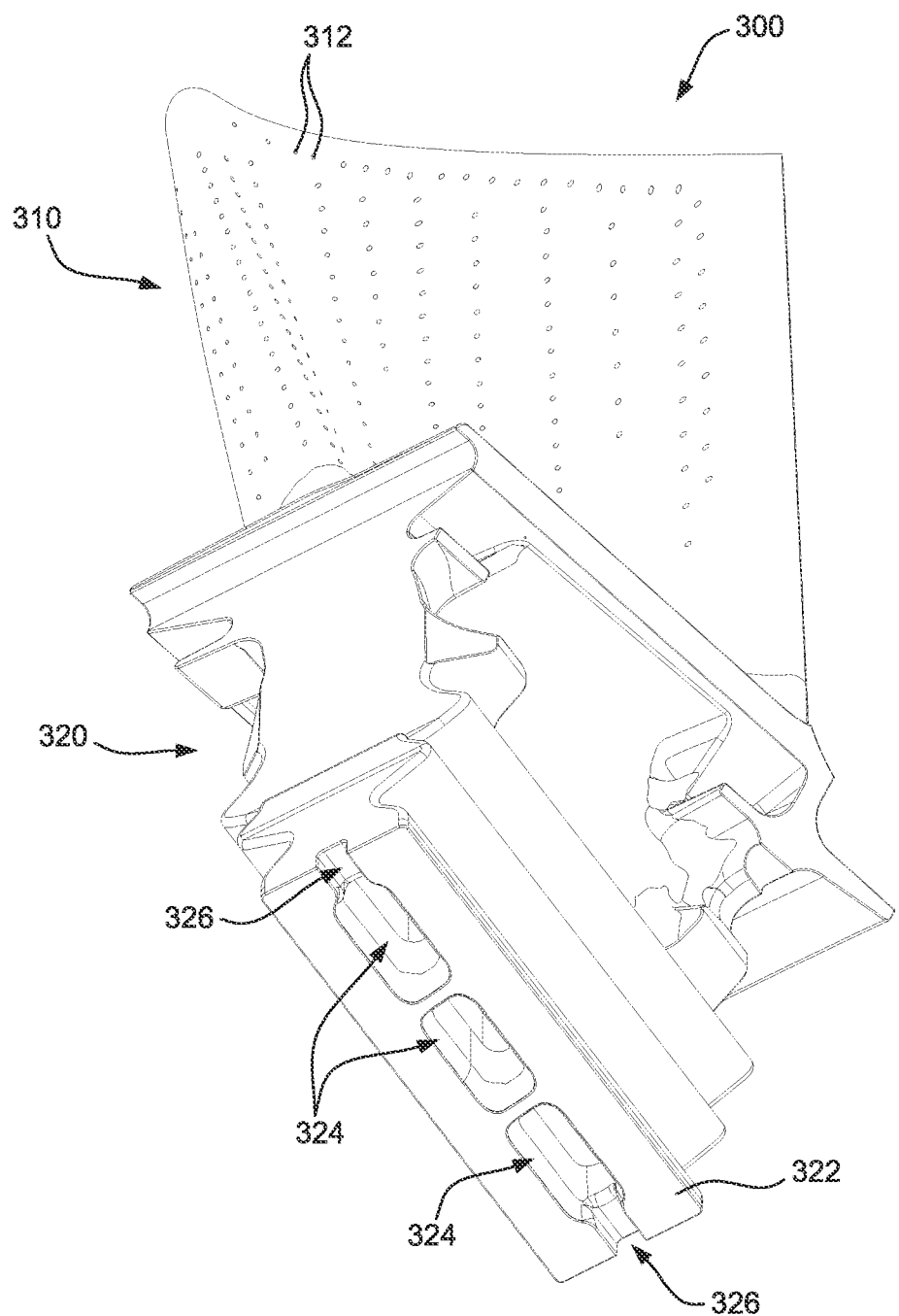
Figure 4:
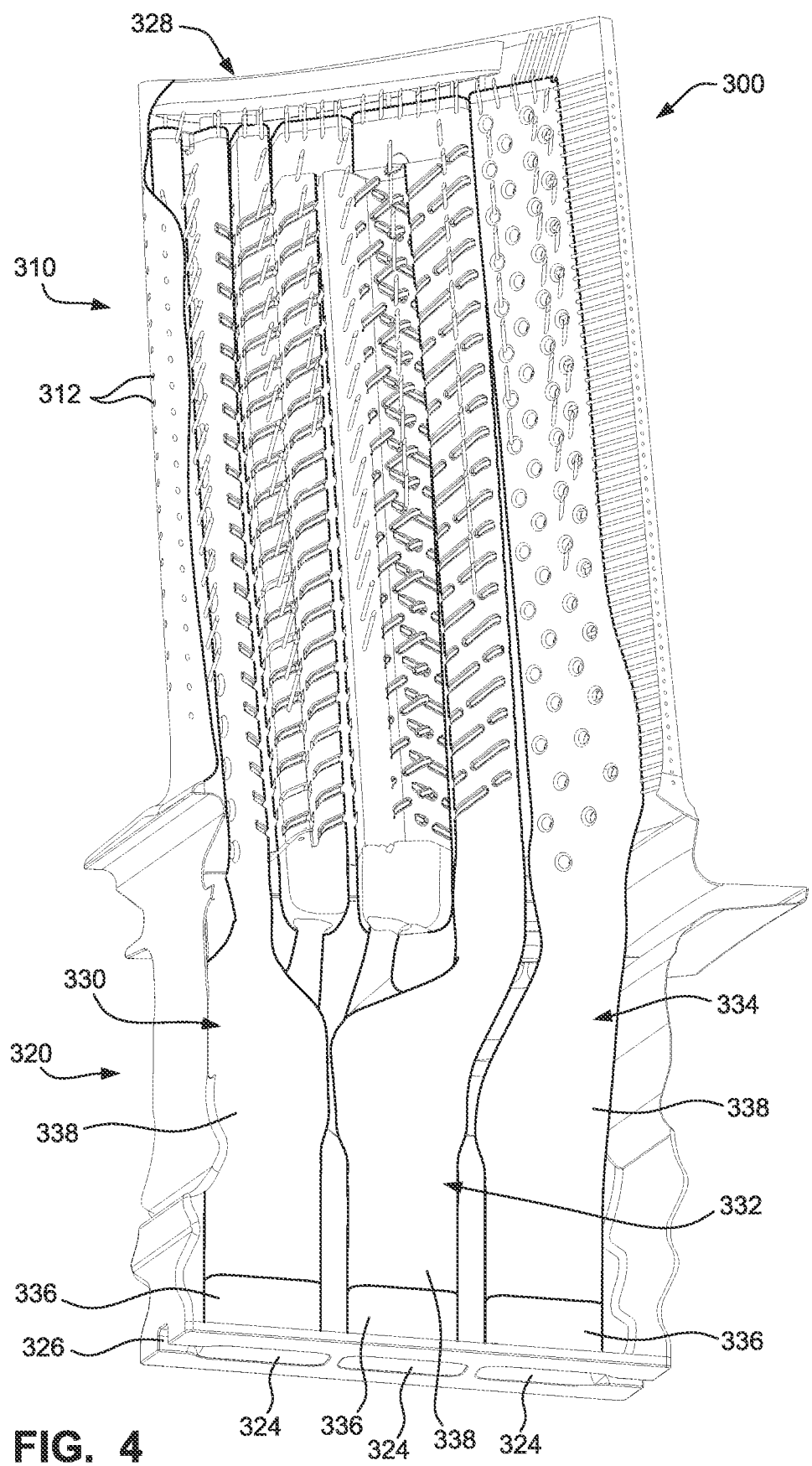
Figure 5:
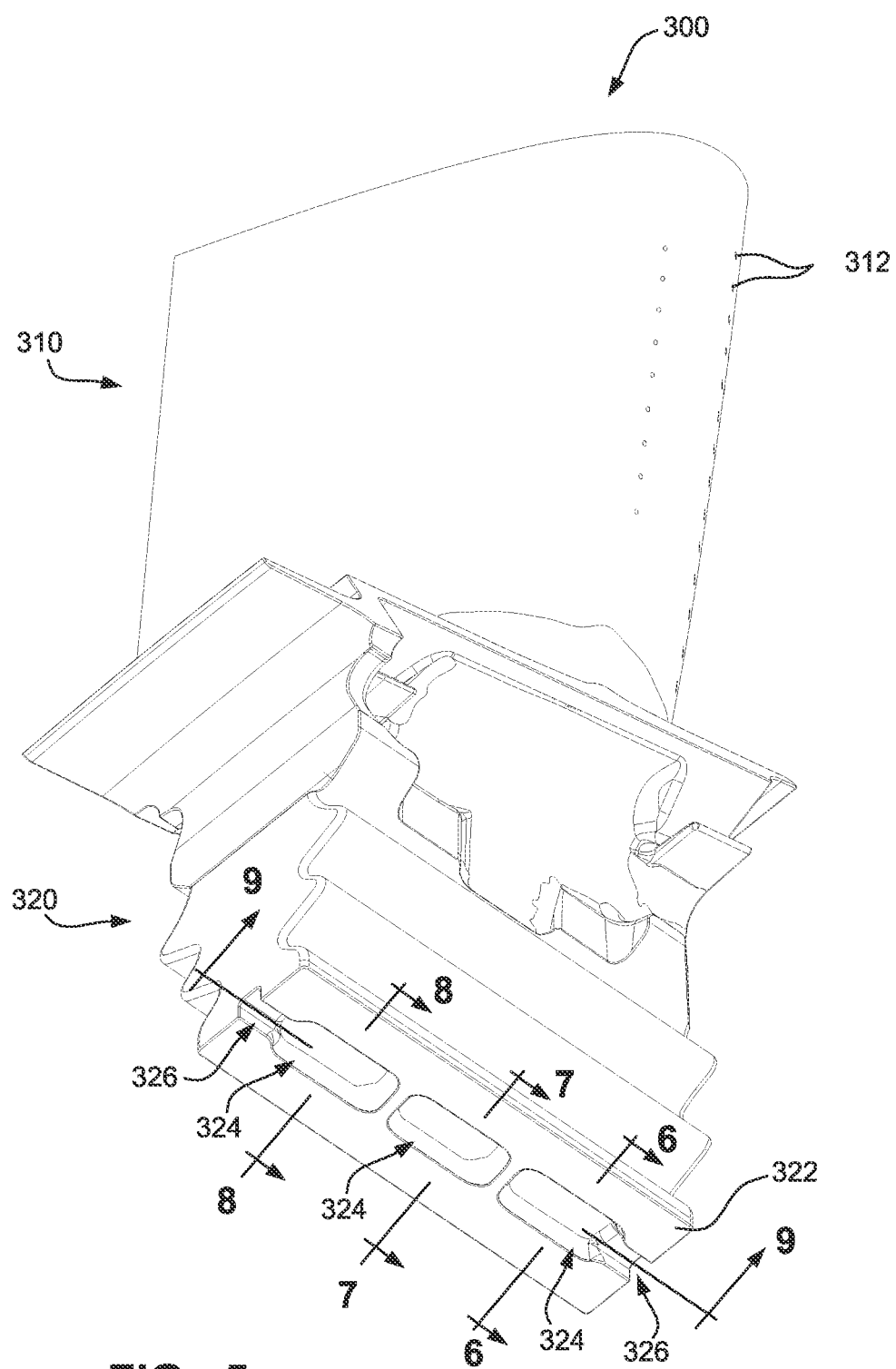
FIG. 5 is another bottom perspective view of the turbine blade of FIG. 3-1.

As can be seen in the cross-sectional views of FIGS. 2-3 and 2-4, all sides of the intermediate portion 260 may taper towards the nozzle tip. In other examples, the intermediate portion 260 may be configured such that only side surfaces or only front and rear surfaces taper while the remaining surfaces extend without tapering. In such configurations, the non-tapering surfaces may still maintain a clearance with the inner walls of the blade. As shown in FIGS. 2-1 to 2-4, upper portions of each nozzle (i.e., portions more towards the nozzle opening) have a smaller cross-sectional profile as compared to lower portions of the nozzle (i.e., portions more towards the base portion 270).

The inlet nozzles 220 may have a cross-sectional shape that is a rounded rectangle. However, other shapes may be suitable, e.g., a stadium shape, oval, ellipse, squircle, circle or other suitable shape having a tapered profile.

As shown in FIGS. 2-1 to 2-3, the inlet nozzles 220 are linearly aligned along the upper surface 212 of the manifold body 210. A locating member 250 may be disposed between each inlet nozzle 220 disposed at the outer sides of the manifold body 210 and a respective side surface 211 of the manifold body. The locating members 250 may be protrusions or ribs extending upwardly from the upper surface 212 of the manifold body. Each locating member 250 may connect to a side portion of the corresponding inlet nozzle 220 and extend to a position flush with the side surface 211. Each locating member 250 may connect with the base portion 270 of the inlet nozzle such that the side section 275 of the base portion is shortened or truncated, as can be seen in FIG. 2-1. The locating members are configured to be received in corresponding positioning members 326 (FIG. 3-2) formed in bottom surface 322 on a root portion of the turbine blade 300. The positioning members 326 may be formed as notches or recesses. Engagement of the locating members 250 in the positioning members 326 helps to provide a stable abutment of the flow distributor 200 with the turbine blade 300 so that relative movement between the flow distributor 200 and the turbine blade 300 is limited or prevented. The combination of the tapering nozzles and the locating members causes the flow distributor to self-locate into the blade internal cavity in stable engagement with the turbine blade.

Turning to FIGS. 3-1, 3-2, 4 and 5, the turbine blade 300 is shown. The turbine blade includes an airfoil portion 310 and a root portion (or fir tree) 320 as those skilled in the art will understand. As shown in FIG. 3-2, a bottom surface 322 of the root portion 320 has a plurality of openings 324 formed therein. In the illustrated example, the turbine blade has three openings 324. As shown in FIG. 4, the openings 324 are connected to the internal cavity of the blade. The internal cavity includes a first cavity portion 330, a second cavity portion 332 and a third cavity portion 334. Each opening 324 is fluidly connected to a respective one of the first, second and third cavity portions 330, 332, 334. Each of the first, second and third cavity portions 330, 332, 334 includes an entrance portion 336 and a channel portion 338. Each channel portion 338 extends towards the blade tip 328 and may include further downstream channel sections that branch from an upstream section of the channel portion 338, as can been seen in FIG. 4. Also, downstream sections of the channel portions 338 may be interconnected. As will be recognized by those skilled in the art, the first, second and third cavity portions 330, 332, 334 are formed in the blade so that a cooling airflow can be passed through the blade during operation of a gas turbine engine. The cooling airflow enters the internal cavity of the blade via the openings 324 and exits the blade through the exit holes 312 formed in the external surface of the airfoil portion 310. During a coating process, the first, second and third cavity portions 330, 332, 334 are used to pass the coating gas 116 through the internals of the blade so that the internal surfaces of the blade can be coated.

Figure 8:
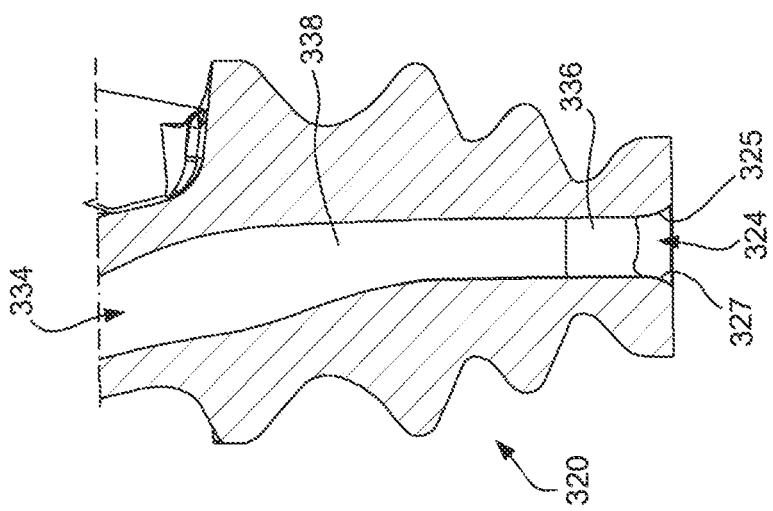
FIG. 8 is a cross-sectional view along the line 8-8 in FIG. 5.
Figure 7:
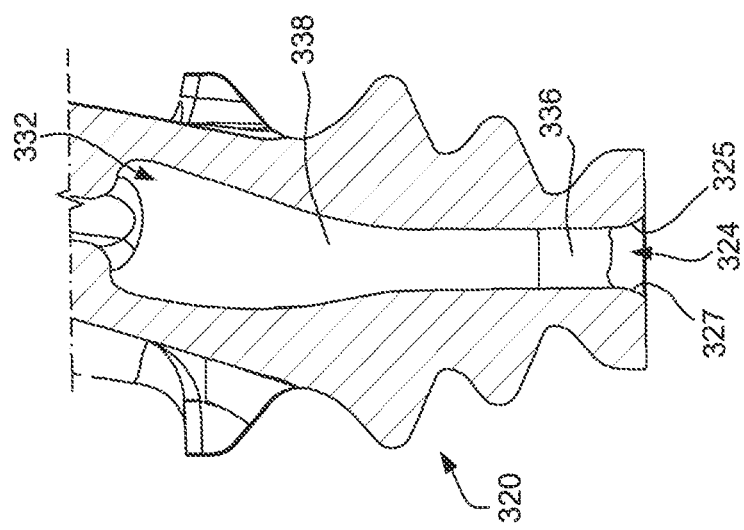
FIG. 7 is a cross-sectional view along the line 7-7 in FIG. 5.
Figure 6:
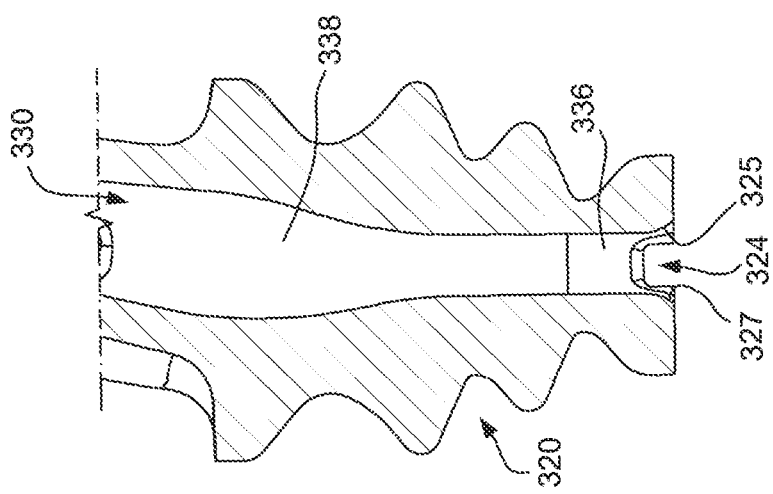
FIG. 6 is a cross-sectional view along the line 6-6 in FIG. 5.
Figure 9:
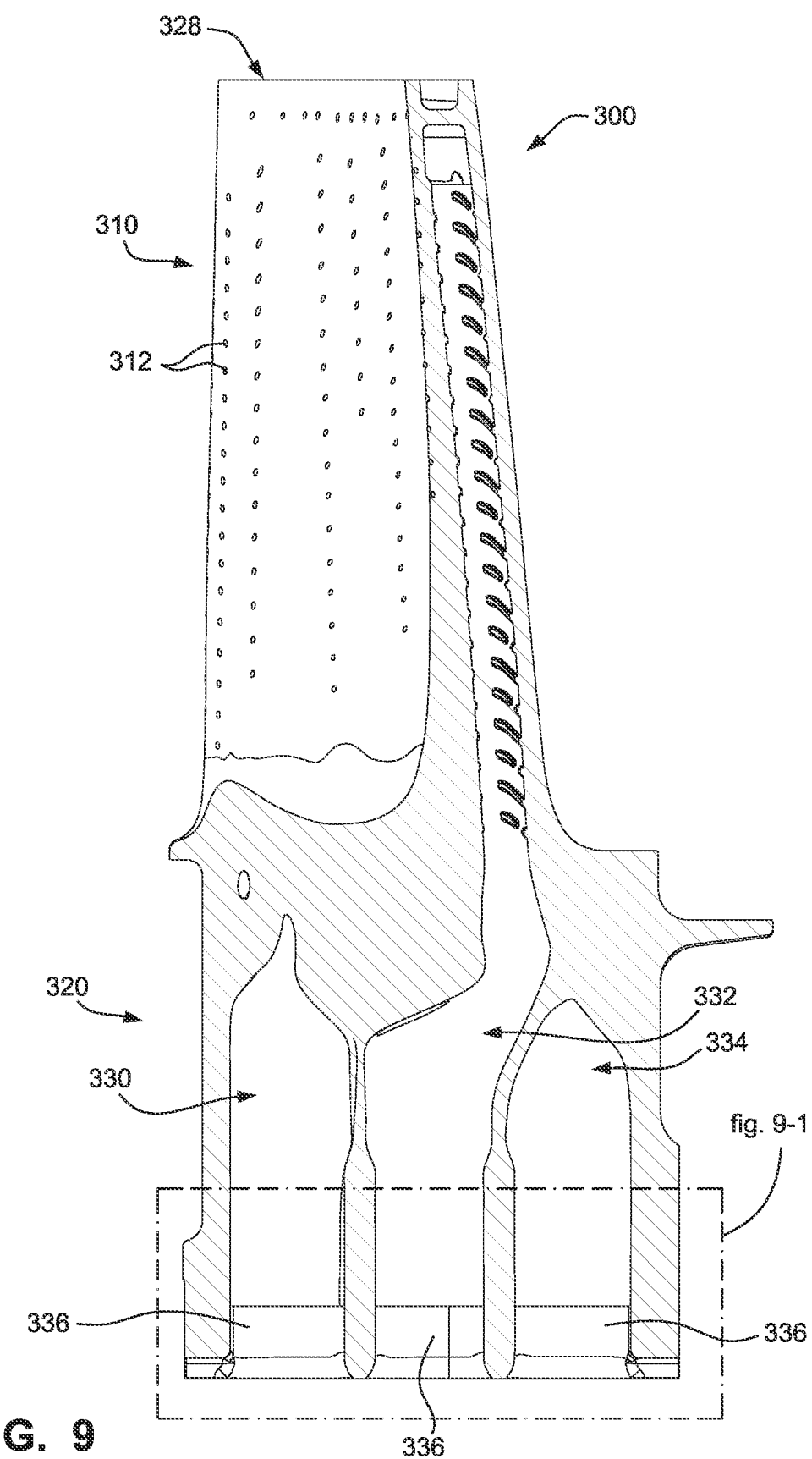
FIG. 9 is a cross-sectional view along the line 9-9 in FIG. 5.
Figures 1, 9:
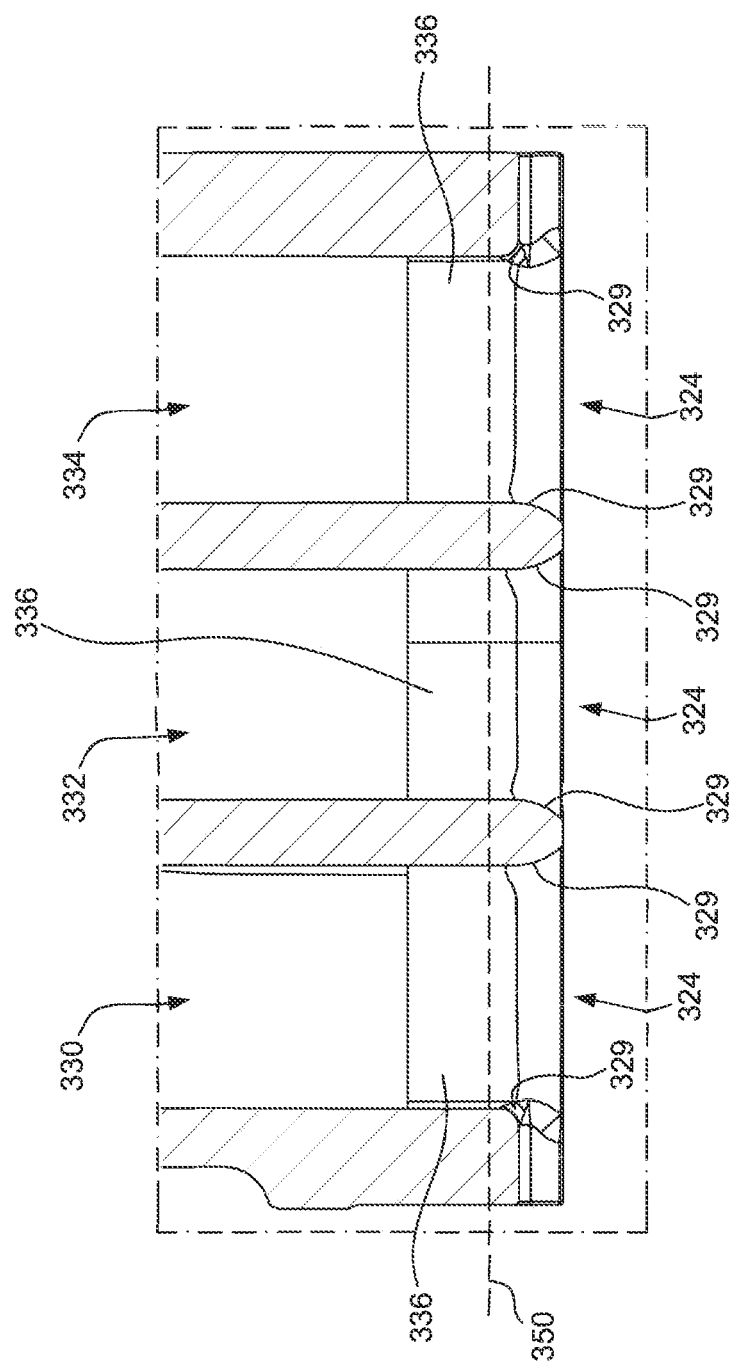
Figures 2, 9:
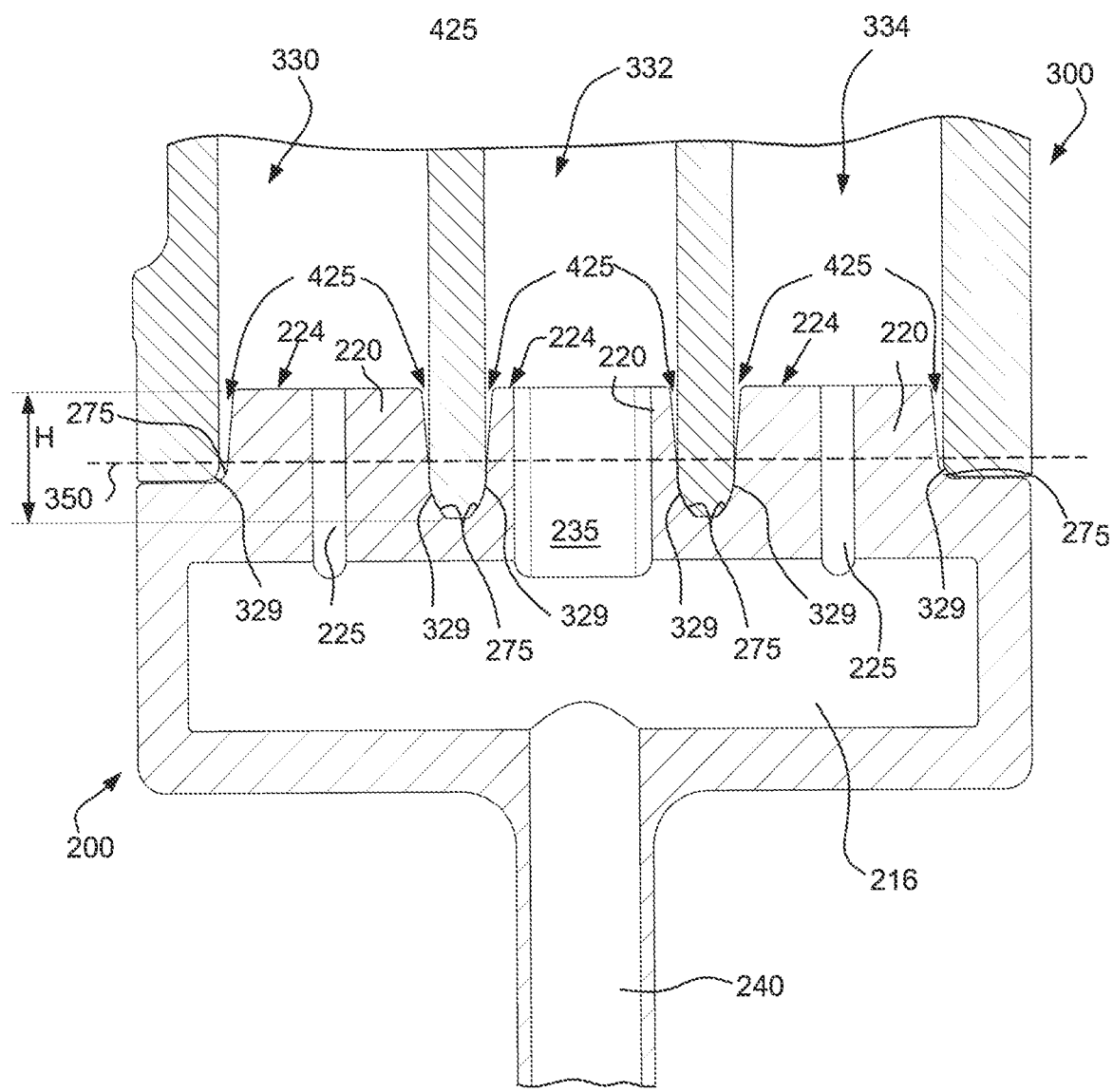

As can be seen in the cross-sectional views of FIGS. 6-8, 9 and 9-1, the entrance portions 336 have inner surfaces that taper from the openings 324 toward the interior of the blade. As shown in FIGS. 6-8, the entrance portion 336 includes a forward surface 325 and a rear surface 327 that taper. Also, as shown in FIG. 9-1, the entrance portion includes side surfaces 329 that taper. In this way, the tapering profiles of the inner surfaces of the entrance portions 336 correspond to the tapering profiles of the inlet nozzles 220 which facilitates easy insertion and self-locating, stable engagement of the flow distributor 200 with the turbine blade 300.

FIG. 9-2 is a cross-sectional view showing the flow distributor 200 inserted into the turbine blade 300. The side sections 275 of the inlet nozzles 220 may have a curvature that corresponds to a curvature of the side surfaces 329 of the turbine blade 300. Also, the front section 272 and the rear section 274 (FIG. 2-4) may have a curvature that corresponds to a curvature of the forward surface 325 and the rear surface 327 (FIGS. 6-8) of the turbine blade. In some examples, surfaces (e.g., the base portion 270) of the nozzles may engage corresponding surfaces of the turbine blade. In the illustrated example of FIG. 9-2, a gap 425 is formed between the inlet nozzles 220 and the inner walls of the first, second and third cavity portions 330, 332, 334. The gaps 425 may form clearances between the inlet nozzles and the turbine blade at the nozzle tip and along the intermediate portion 260 of the nozzles. However, the base portion 270 of the inlet nozzles may engage corresponding surfaces of the turbine blade. In other examples, a clearance may be maintained between all surfaces of the inlet nozzles and the inner surfaces of the turbine blade. In such an arrangement, the upper surface 212 of the manifold body 210 may engage the bottom surface 322 of the turbine blade while leaving a clearance between surfaces of the inlet nozzles and the inner walls of the blade.

As shown in FIGS. 9-1 and 9-2, a line of demarcation 350 in reference to the turbine blade 300 may indicate a separation between inner surfaces of the blade that are intended to be coated and inner surfaces that are not intended to be coated. For example, inner surfaces near the openings 324 are not intended to be coated in order to avoid the risk of the coating gas 116 escaping the internal cavity and coating the outer surfaces of the fir tree. Thus, the height (H) of the inlet nozzles 220 is determined so as to ensure the coating gas does not coat inner surfaces of the blade below the line of demarcation 350. It is also desirable to configure the flow distributor 200 to promote a laminar flow of the coating gas through the turbine blade since it is less likely that the coating gas will backflow towards the openings 324 when the flow is laminar. A turbulent flow, on the other hand, increases the risk that the coating gas will backflow towards the openings 324.

Turning to FIGS. 10-1 to 12-3, flow distributors 500, 600, 700 according to other examples of the disclosed technology are shown. The flow distributors 500, 600, 700 may include an exhaust nozzle 280 such that instead of the coating gas exiting the blade through exit holes formed in external surfaces of the blade airfoil, the coating gas will flow through a dedicated internal cavity of the turbine blade back towards the blade root and then back into the flow distributor. This exhaust coating gas is then received into the flow distributor via the exhaust nozzle 280. The exhaust nozzle 280 may include a nozzle tip 284 and an exhaust nozzle opening 282 formed in the nozzle tip. An exhaust nozzle channel 285 may connect to an exhaust passageway that is used to discharge the exhaust gas out of the flow distributor. In the illustrated examples, the exhaust nozzle 280 is disposed at a central portion of the manifold body 210; however, it is noted that the inlet nozzles 220 and exhaust nozzle 280 could have any arrangement along the upper surface 212 of the manifold body depending on the internal cavity arrangement of the turbine blade.

It is noted that the exhaust nozzle 280 may have any of the features described above with regard to the inlet nozzles 220. For example (but not limited to such examples), the exhaust nozzle 280 may have the same tapering surfaces, clearances with the turbine blade, height H, intermediate portion 260, and/or base portion 270 as described above regarding the inlet nozzles. Further, any of the features described above with reference to the flow distributor 200 may be applicable to the flow distributors 500, 600, 700. For example, the flow distributors 500, 600, 700 may include locating member 250 even though locating members are not shown in the illustrated examples. Also, although the illustrated example in FIGS. 10-1 to 10-3 does not include a base portion 270, the flow distributor 500 could include a base portion in other examples.

Figures 1, 10:
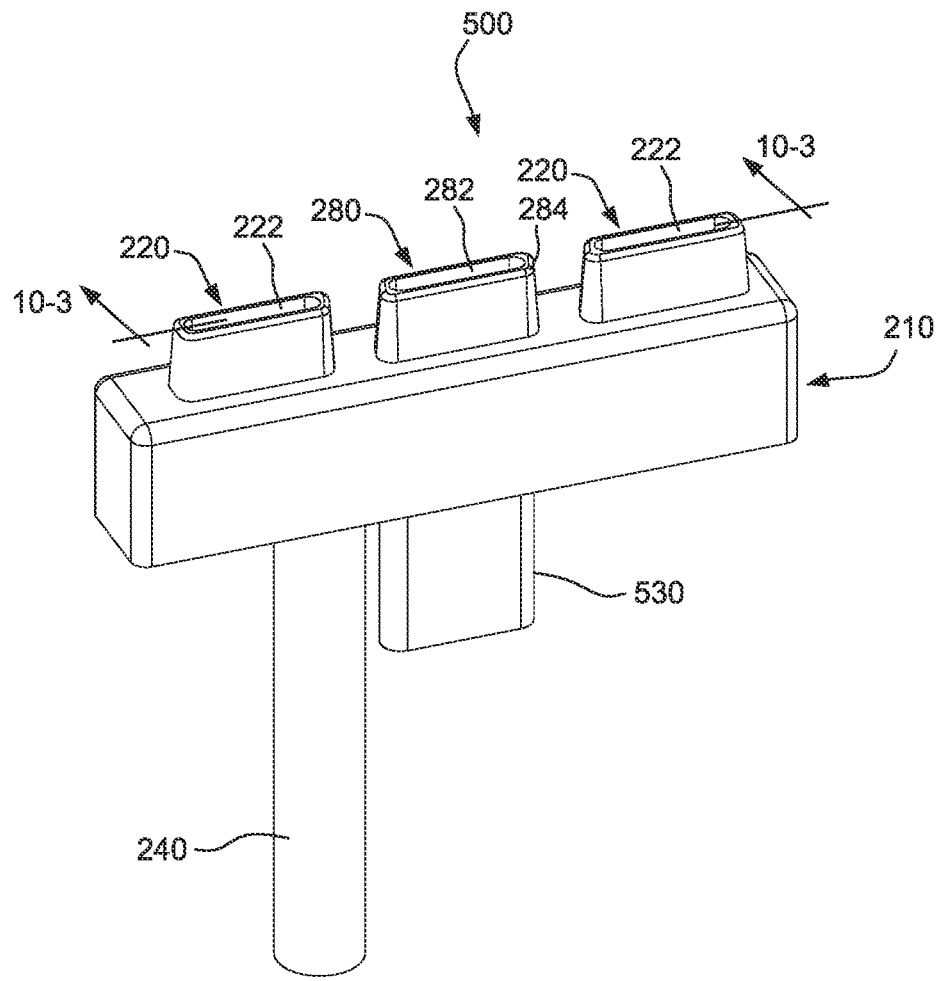
Figures 2, 10:
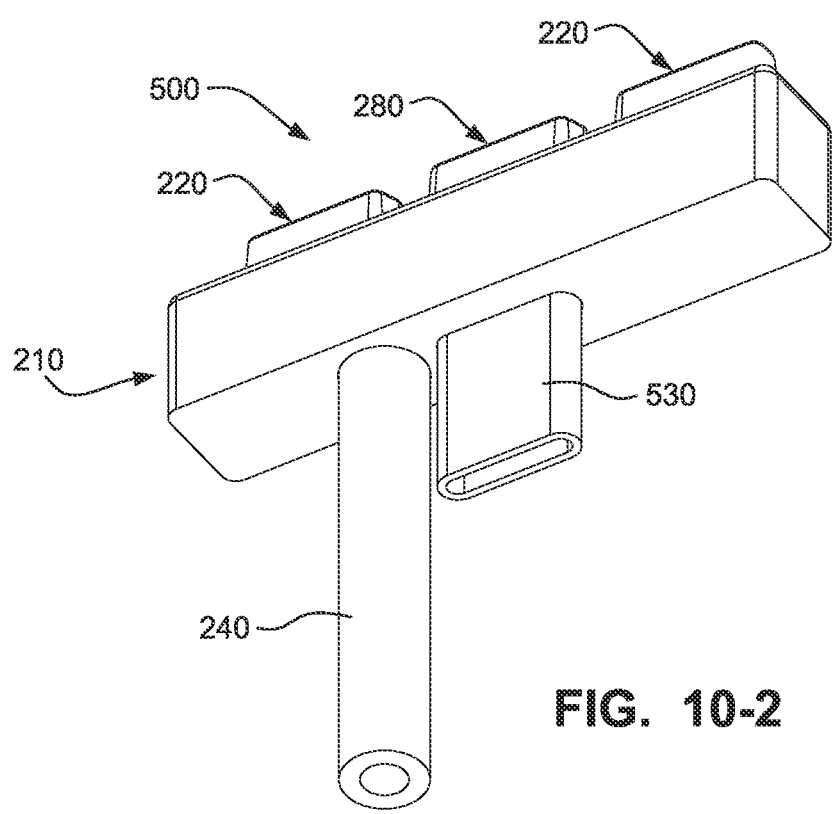
Figures 3, 10:
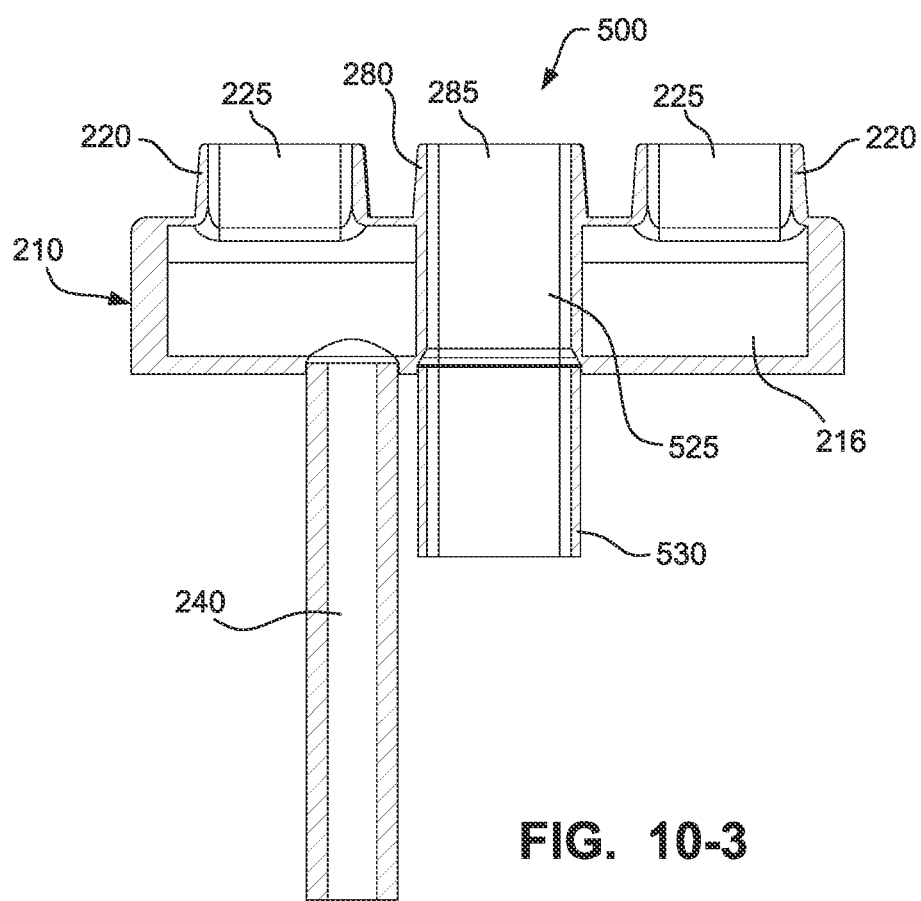

Referring to FIGS. 10-1 to 10-3, the flow distributor 500 may be a multi-chamber flow distributor. While the inlet nozzles 220 are fluidly connected to the manifold chamber 216, the nozzle channel 285 of the exhaust nozzle 280 is fluidly connected to an exhaust passageway 525. The exhaust passageway 525 is not in fluid connection with the manifold chamber 216 and thus may function as a second, separate chamber of the manifold body 210. An exhaust tube 530 is connected to an outlet port of the manifold body to receive the exhaust flow from the exhaust passageway 525.

Figures 1, 11:
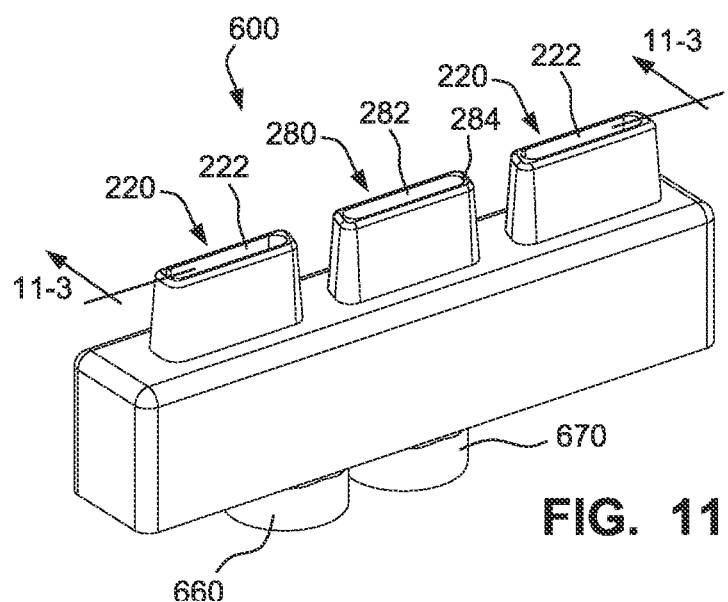
Figures 2, 11:
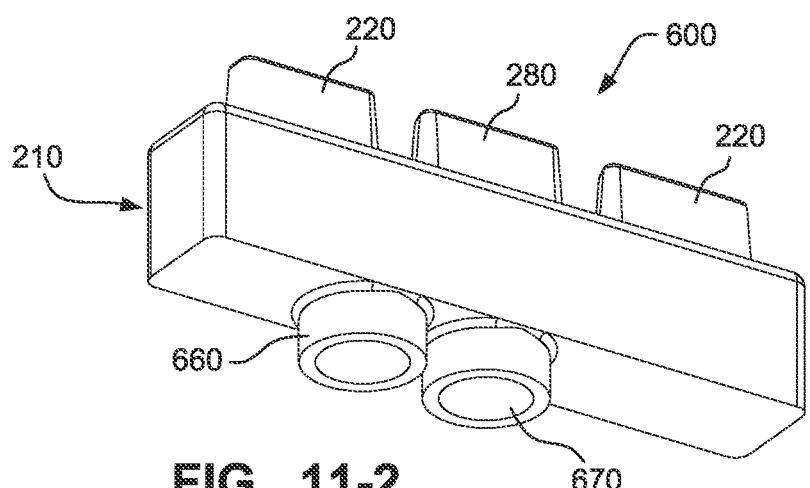
Figures 3, 11:
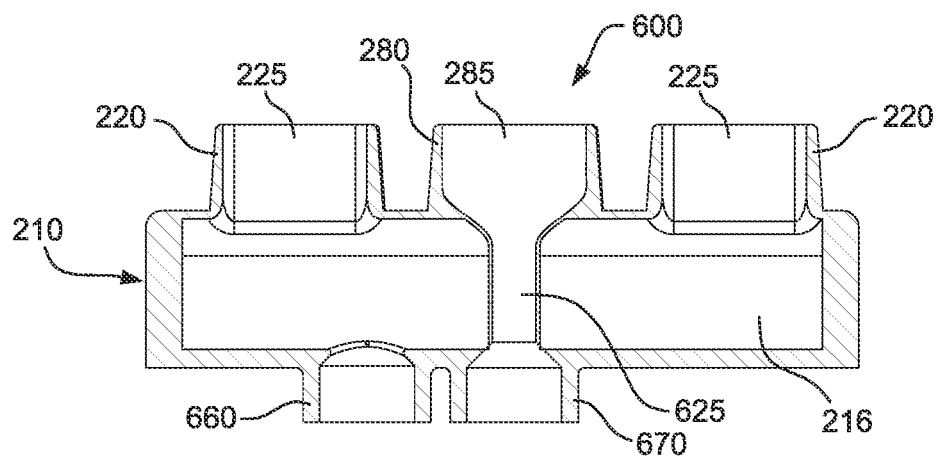

Similar to the flow distributor 500, the flow distributor 600 may also have multiple chambers, as shown in FIGS. 11-1 to 11-3. The flow distributor 600 may include an exhaust passageway 625 that has a smaller volume than the exhaust passageway 525 of the flow distributor 500. The manifold body 210 may include a supply port 660 to receive a supply tube and an exhaust port 670 to connect with an exhaust tube.

Figures 1, 12:
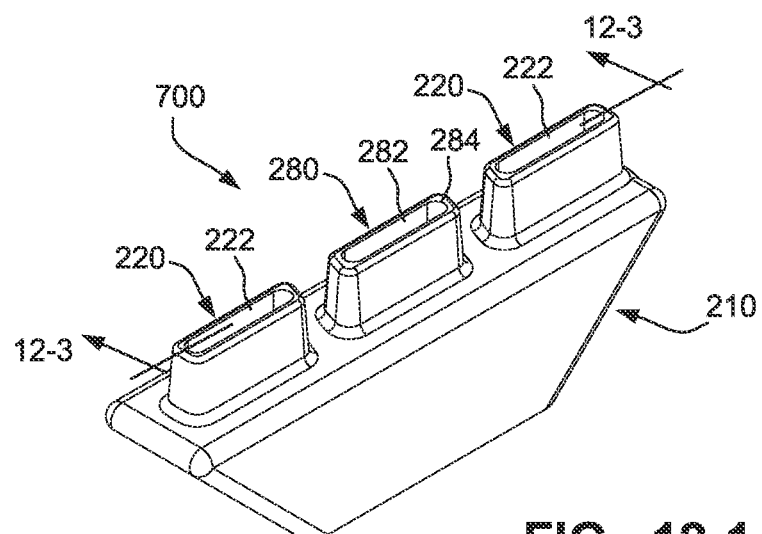
Figures 2, 12:
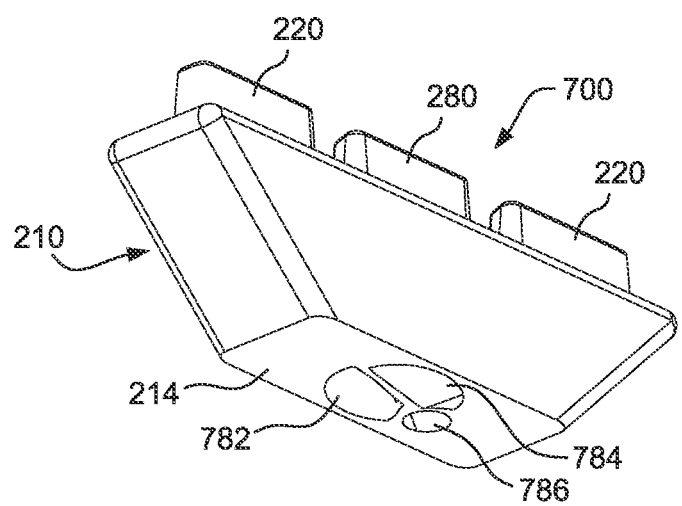
Figures 3, 12:
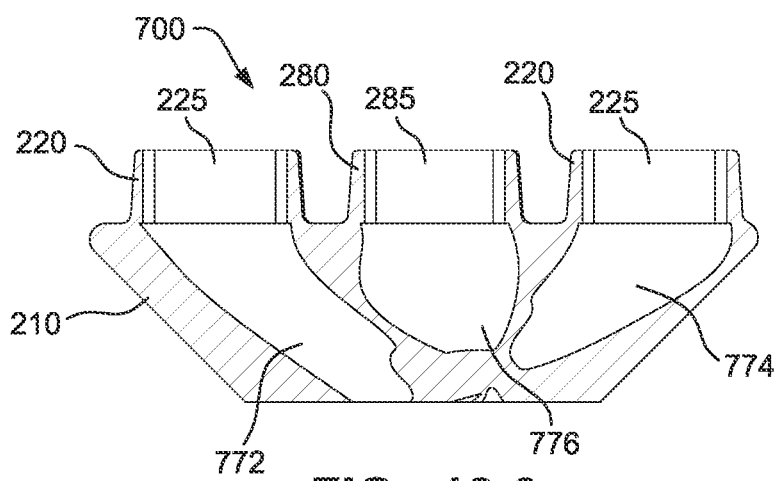

Turning to FIGS. 12-1 to 12-3, the flow distributor 700 may be a multi-chamber flow distributor that includes dedicated inlet passageways to separately supply two internal cavity portions of the turbine blade. The underside surface 214 of the manifold body 210 may have a first inlet port 782, a second inlet port 784 and an exhaust port 786 form therein. The first inlet port 782 is connected to a first inlet flow passage 772 that connects to the inlet nozzle channel 225 of one of the inlet nozzles 220. The second inlet port 784 is connected to a second inlet flow passage 774 that connects to the inlet nozzle channel 225 of the other inlet nozzle 220. The exhaust port 786 is connected to an exhaust flow passage 776 that connects to the exhaust nozzle channel 285 of the exhaust nozzle 280. The first inlet flow passage 772, the second inlet flow passage 774 and the exhaust flow passage 776 are not fluidly connected and may be considered separate chambers in the manifold body 210.

However, in other examples, the flow distributor 700 may function as a single direction flow distributor utilizing all three circuits to flow the coating gas into the turbine blade. As such, the exhaust port 786, exhaust flow passage 776, exhaust nozzle channel 285, and exhaust nozzle 280 may instead function, respectively, as a third inlet port, a third inlet flow passage, a third inlet nozzle channel, and a third inlet nozzle. In such an arrangement, the coating gas may exit the blade through exit holes 312 formed in the turbine airfoil portion, as described earlier.

Figure 13:
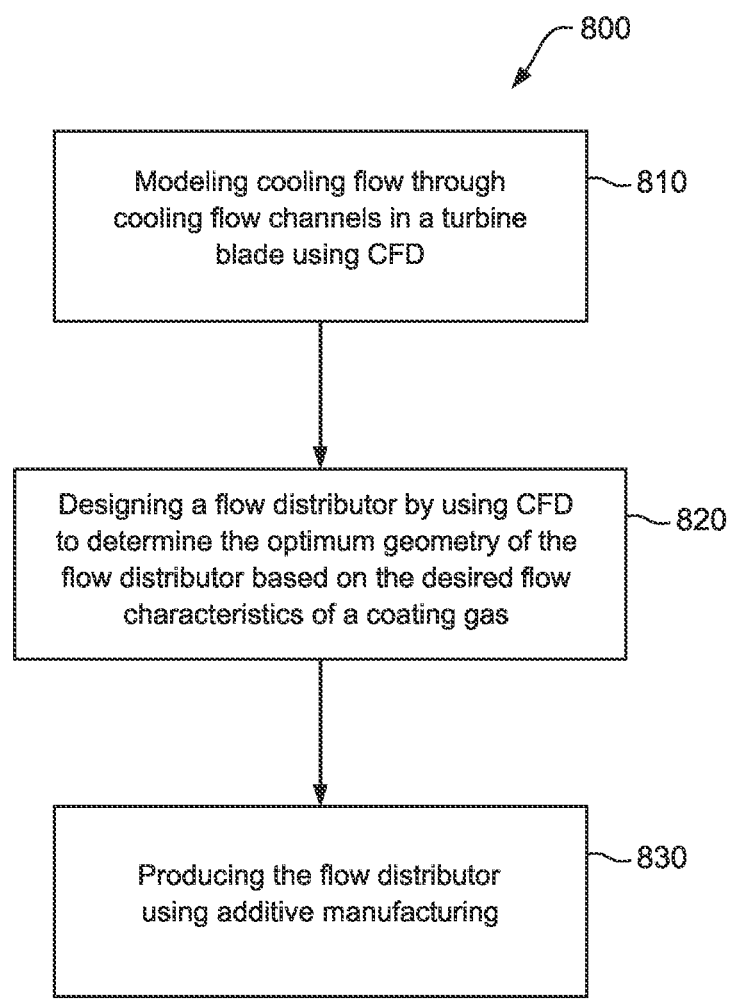
FIG. 13 illustrates a process of making a flow distributor according to an example of the disclosed technology.

FIG. 13 illustrates a process 800 of making a fluid flow distributor for conveying a coating gas into internal flow channels of a turbine blade. Step 810 of the process involves modeling fluid flow through the cooling flow channels in the turbine blade 300 using computational fluid dynamics (CFD) software. A computing device with at least one processor, such as a computer, may be used to run the CFD application. Data including parameters associated with fluid dynamics of a fluid flow through the internal cavities of the turbine blade such as information defining a geometry of the internal cavities may be stored to non-transitory storage for use in the CFD application. The stored data may also include information defining the geometry of the fluid flow distributor, e.g., a volume of the chamber(s) in the fluid flow distributor, a height of the nozzles, and a size of the nozzle openings of the inlet nozzles and/or exhaust nozzle).

Step 820 of the process involves configuring a flow distributor by using the CFD software application to determine the optimum geometry of the flow distributor based on the desired flow characteristics (e.g., laminar flow) of the fluid (e.g., a particular coating gas). This may involve running simulations in the CFD application to predict characteristics of the fluid flow through the internal cavities of the turbine blade when the fluid flow passes through the fluid flow distributor before entering the internal cavities of the turbine blade. The CFD application may then be used to optimize the characteristics of the fluid flow according to desired characteristics by modifying the information defining the geometry of the fluid flow distributor.

Step 830 involves utilizing the information defining the optimized geometry of the fluid flow distributor to manufacture a fluid flow distributor using additive manufacturing (e.g., 3D printing). The fluid flow distributor may be constructed from the material Hastelloy X. However, other suitable materials such as Inconel 100, Inconel 600, and RA330 may be used. Materials with Nickel contents ranging from about 40% to about 75% are generally suitable. For example, Nickel-Chromium alloys may be suitable. Furthermore, materials that are stable at extended exposures up to and exceeding 2000° F. may also be applicable.

There are many variables that may be factored into the CFD simulations, as embodied by the disclosed technology. For example, the specific fluid may be defined (e.g., air or a specific gas) as well as the pressure, flow rate and temperature of the fluid. Other variables include defining the material and geometry of the internal flow cavities, heat transfer types and heat transfer coefficients, as well as target conditions such as flow type (e.g., laminar or turbulent), temperature of the coating gas and flow rate of the coating gas.

While at least one exemplary embodiment of the present invention(s) is disclosed herein, it should be understood that modifications, substitutions and alternatives may be apparent to one of ordinary skill in the art and can be made without departing from the scope of this disclosure. This disclosure is intended to cover any adaptations or variations of the exemplary embodiment(s). In addition, in this disclosure, the terms "comprise" or "comprising" do not exclude other elements or steps, the terms "a" or "one" do not exclude a plural number, and the term "or" means either or both, unless this application states otherwise. Also, the terms "approximately", "about", and "substantially" encompass a range of plus or minus 15%. Furthermore, characteristics or steps which have been described may also be used in combination with other characteristics or steps and in any order unless the disclosure or context suggests otherwise.

What is claimed is:

1. A fluid flow distributor for insertion into a root portion of a turbine component for conveying a coating gas to internal flow channels of the turbine component, the fluid flow distributor comprising:
   a manifold body having a first inlet port configured to receive a supply of coating gas, the manifold body having an upper surface;
   a first chamber formed in an interior space of the manifold body and configured to receive the supply of coating gas via the first inlet port;
   a first inlet nozzle protruding from the upper surface and including a first inlet nozzle channel in fluid communication with the first chamber, the first inlet nozzle having a first inlet nozzle tip and a first intermediate portion disposed between the first inlet nozzle tip and the upper surface of the manifold body; and
   a second inlet nozzle protruding from the upper surface, the second inlet nozzle having a second inlet nozzle tip and a second intermediate portion disposed between the second inlet nozzle tip and the upper surface of the manifold body,
   wherein the first intermediate portion and the second intermediate portion are tapered, respectively, towards the first inlet nozzle tip and the second inlet nozzle tip to facilitate insertion of the first inlet nozzle and the second inlet nozzle into the root portion of the turbine component.

2. The fluid flow distributor of claim 1, wherein the second inlet nozzle includes a second inlet nozzle channel in fluid communication with the first chamber.

3. The fluid flow distributor of claim 1, wherein the manifold body has a second inlet port configured to receive the supply of coating gas, a second chamber being formed in the interior space of the manifold body and configured to receive the supply of coating gas via the second inlet port, the second inlet nozzle including a second inlet nozzle channel in fluid communication with the second chamber, and
   wherein the first chamber and the second chamber are not fluidly connected in the manifold body.

4. The fluid flow distributor of claim 1, wherein the first inlet nozzle includes a first base portion disposed between the first intermediate portion and the upper surface of the manifold body.

5. The fluid flow distributor of claim 4, wherein the first base portion comprises a first fillet having a curved surface that provides a smooth transition between the first intermediate portion and the upper surface of the manifold body.

6. The fluid flow distributor of claim 5, wherein the taper of the first intermediate portion and the fillet of the first base portion are configured to guide insertion of the first inlet nozzle into the root portion of the turbine component such that the fluid flow distributor self-locates relative to the turbine component.

7. The fluid flow distributor of claim 1, further comprising a third inlet nozzle protruding from the upper surface and including a third inlet nozzle channel in fluid communication with the first chamber.

8. The fluid flow distributor of claim 7, wherein the first inlet nozzle, the second inlet nozzle and the third inlet nozzle are linearly aligned along the upper surface of the manifold body.

9. The fluid flow distributor of claim 1, further comprising an exhaust nozzle protruding from the upper surface and including an exhaust nozzle channel, the exhaust nozzle having an exhaust nozzle tip and an exhaust nozzle intermediate portion disposed between the exhaust nozzle tip and the upper surface of the manifold body,
   wherein the exhaust nozzle intermediate portion is tapered towards the exhaust nozzle tip to facilitate insertion of the exhaust nozzle into the root portion of the turbine component.

10. The fluid flow distributor of claim 9, wherein the exhaust nozzle channel is connected to an exhaust passageway that is not in fluid communication with the first chamber, the exhaust passageway being fluidly connected to an exhaust port of the manifold body.

11. The fluid flow distributor of claim 9, wherein the exhaust nozzle channel is in fluid communication with an exhaust chamber formed in the manifold body, the exhaust chamber being fluidly connected to an exhaust port of the manifold body,
   wherein the manifold body has a second inlet port in fluid communication with a second chamber formed in the manifold body, the second inlet nozzle including a second inlet nozzle channel in fluid communication with the second chamber, and
   wherein none of the first chamber, the second chamber and the exhaust chamber are fluidly connected in the manifold body.

12. A fluid flow distributor for insertion into a root portion of a turbine component for conveying a coating gas to internal flow channels of the turbine component, the fluid flow distributor comprising:
- a manifold body having a first inlet port configured to receive a supply of coating gas, the manifold body having an upper surface;
- a first chamber formed in an interior space of the manifold body and configured to receive the supply of coating gas via the first inlet port;
- a first inlet nozzle protruding from the upper surface and including a first inlet nozzle channel in fluid communication with the first chamber, the first inlet nozzle being configured to be inserted into the root portion of the turbine component for conveying the coating gas from the first inlet nozzle channel into an internal cavity of the turbine component; and
- a first member protruding from the upper surface of the manifold body and configured for mating with a first recess formed in the root portion of the turbine component for locating and securing the fluid flow distributor relative to the turbine component when the first inlet nozzle is inserted into the root portion of the turbine component,
- wherein, in a transverse cross-sectional view through a portion of the fluid flow distributor that includes the first member, a width of the first member is less than a width of the manifold body.

13. The fluid flow distributor of claim 12, wherein the first member is positioned along a first lateral edge portion of the upper surface of the manifold body.

14. The fluid flow distributor of claim 13, further comprising a second member protruding from the upper surface of the manifold body and configured for mating with a second recess formed in the root portion of the turbine component for locating and securing the fluid flow distributor relative the turbine component when the first inlet nozzle is inserted into the root portion of the turbine component.

15. The fluid flow distributor of claim 14, wherein the second member is positioned along a second lateral edge portion of the upper surface of the manifold body, the second lateral edge portion being opposite the first lateral edge portion.

16. The fluid flow distributor of claim 15, wherein the first inlet nozzle is disposed along the upper surface of the manifold body at a position between the first member and the second member.

17. The fluid flow distributor of claim 14, wherein the second member is a rib or a protrusion.

18. The fluid flow distributor of claim 12, further comprising a second inlet nozzle protruding from the upper surface and including a second inlet nozzle channel in fluid communication with the first chamber, the second inlet nozzle being configured to be inserted into the root portion of the turbine component for conveying the coating gas from the second inlet nozzle channel into the internal cavity of the turbine component.

19. The fluid flow distributor of claim 12, wherein the first member is a rib or a protrusion.

20. A fluid flow distributor for insertion into a root portion of a turbine component for conveying a coating gas to internal flow channels of the turbine component, the fluid flow distributor comprising:
- a manifold body having a first inlet port configured to receive a supply of coating gas, the manifold body having an upper surface;
- a first chamber formed in an interior space of the manifold body and configured to receive the supply of coating gas via the first inlet port;
- a first inlet nozzle protruding from the upper surface and including a first inlet nozzle channel in fluid communication with the first chamber, the first inlet nozzle being configured to be inserted into the root portion of the turbine component for conveying the coating gas from the first inlet nozzle channel into an internal cavity of the turbine component; and
- a first member protruding from the upper surface of the manifold body and configured for mating with a first recess formed in the root portion of the turbine component for locating and securing the fluid flow distributor relative to the turbine component when the first inlet nozzle is inserted into the root portion of the turbine component,
- wherein the first member is connected to a side portion of the first inlet nozzle and has a length from the first inlet nozzle to a lateral end of the first member in a longitudinal direction towards a first lateral edge of the upper surface of the manifold body, and
- wherein the length of the first member is greater than a width of the first member.

* * * * *